(12) United States Patent
Gebauer et al.

(10) Patent No.: US 10,714,461 B2
(45) Date of Patent: Jul. 14, 2020

(54) ELECTRONIC UNIT

(71) Applicant: VISHAY SEMICONDUCTOR GMBH, Heilbronn (DE)

(72) Inventors: Christoph Paul Gebauer, Heilbronn (DE); Alexander Kamay, Güglingen-Frauenzimmern (DE)

(73) Assignee: VISHAY SEMICONDUCTOR GMBH, Heilbronn (DE)

( * ) Notice: Subject to any disclaimer, the term of this patent is extended or adjusted under 35 U.S.C. 154(b) by 0 days.

(21) Appl. No.: 16/091,010

(22) PCT Filed: Mar. 15, 2017

(86) PCT No.: PCT/EP2017/056155
§ 371 (c)(1),
(2) Date: Oct. 3, 2018

(87) PCT Pub. No.: WO2017/174312
PCT Pub. Date: Oct. 12, 2017

(65) Prior Publication Data
US 2019/0067259 A1    Feb. 28, 2019

(30) Foreign Application Priority Data
Apr. 4, 2016   (DE) .................. 10 2016 106 135

(51) Int. Cl.
*H01L 23/14*     (2006.01)
*H01L 25/16*     (2006.01)
(Continued)

(52) U.S. Cl.
CPC ........ *H01L 25/167* (2013.01); *H01L 21/4803* (2013.01); *H01L 21/486* (2013.01);
(Continued)

(58) Field of Classification Search
None
See application file for complete search history.

(56) References Cited

U.S. PATENT DOCUMENTS

| 6,991,470 B2 | 1/2006 | Muench | |
| 2004/0092174 A1* | 5/2004 | Eichorn | ................ H01R 12/58 |
| | | | 439/876 |

(Continued)

FOREIGN PATENT DOCUMENTS

| DE | 10 2005 025 606 A1 | 12/2006 |
| DE | 10 2009 019 782 A1 | 11/2010 |

(Continued)

OTHER PUBLICATIONS

Groover, Mikell P.; "Fundamentals of Modern Manufacturing: Materials, Processes, and Systems"; Fourth Edition; Jan. 1, 2010; pp. 10-15. XP055450365; ISBN: 978-0-470-46700-8.

*Primary Examiner* — Cheung Lee
(74) *Attorney, Agent, or Firm* — Volpe and Koenig, P.C.

(57) ABSTRACT

The present invention relates to an electronic unit having at least one first electronic component and one second electronic component that are fastened to a substrate. A shielding is arranged between the first and second electronic components that comprises an elevated portion that projects from a plane defined by the substrate or that extends from its surface, that acts as a shielding and that is formed in one piece with the substrate.

19 Claims, 8 Drawing Sheets

(51) Int. Cl.
*H01L 23/552* (2006.01)
*H01L 23/00* (2006.01)
*H01L 23/13* (2006.01)
*H01L 23/498* (2006.01)
*H01L 21/48* (2006.01)
*H01L 31/0203* (2014.01)
*H01L 31/173* (2006.01)
*H01L 23/04* (2006.01)
*H05K 1/02* (2006.01)

(52) U.S. Cl.
CPC .............. *H01L 23/04* (2013.01); *H01L 23/13* (2013.01); *H01L 23/49827* (2013.01); *H01L 23/552* (2013.01); *H01L 24/48* (2013.01); *H01L 24/85* (2013.01); *H01L 25/165* (2013.01); *H01L 31/0203* (2013.01); *H01L 31/173* (2013.01); *H01L 23/49861* (2013.01); *H01L 24/49* (2013.01); *H01L 2224/32257* (2013.01); *H01L 2224/48137* (2013.01); *H01L 2224/48227* (2013.01); *H01L 2224/48228* (2013.01); *H01L 2224/48247* (2013.01); *H01L 2224/48465* (2013.01); *H01L 2224/48471* (2013.01); *H01L 2224/48479* (2013.01); *H01L 2224/48511* (2013.01); *H01L 2224/49113* (2013.01); *H01L 2224/73265* (2013.01); *H01L 2224/83447* (2013.01); *H01L 2224/85051* (2013.01); *H01L 2224/85186* (2013.01); *H01L 2224/85207* (2013.01); *H01L 2224/85447* (2013.01); *H01L 2224/85986* (2013.01); *H01L 2924/00014* (2013.01); *H01L 2924/12041* (2013.01); *H01L 2924/12043* (2013.01); *H01L 2924/181* (2013.01); *H01L 2924/18161* (2013.01); *H05K 1/0224* (2013.01); *H05K 2201/0715* (2013.01); *H05K 2201/09045* (2013.01)

(56) References Cited

U.S. PATENT DOCUMENTS

| | | | |
|---|---|---|---|
| 2004/0245655 A1* | 12/2004 | Ida | H01L 23/13 257/784 |
| 2005/0012574 A1 | 1/2005 | Drevon et al. | |
| 2008/0237873 A1 | 10/2008 | Shim et al. | |
| 2009/0189261 A1 | 7/2009 | Lim et al. | |
| 2011/0051352 A1* | 3/2011 | Kim | H05K 5/0278 361/679.31 |
| 2012/0320559 A1* | 12/2012 | Kimura | H01L 23/552 361/818 |
| 2013/0075764 A1 | 3/2013 | Yu | |

FOREIGN PATENT DOCUMENTS

| | | |
|---|---|---|
| JP | S61204989 A | 9/1986 |
| JP | H0513068 U | 1/1993 |
| JP | 2010114114 A | 5/2010 |
| WO | 03/067940 A2 | 8/2003 |
| WO | 2006/046221 A2 | 5/2006 |

\* cited by examiner

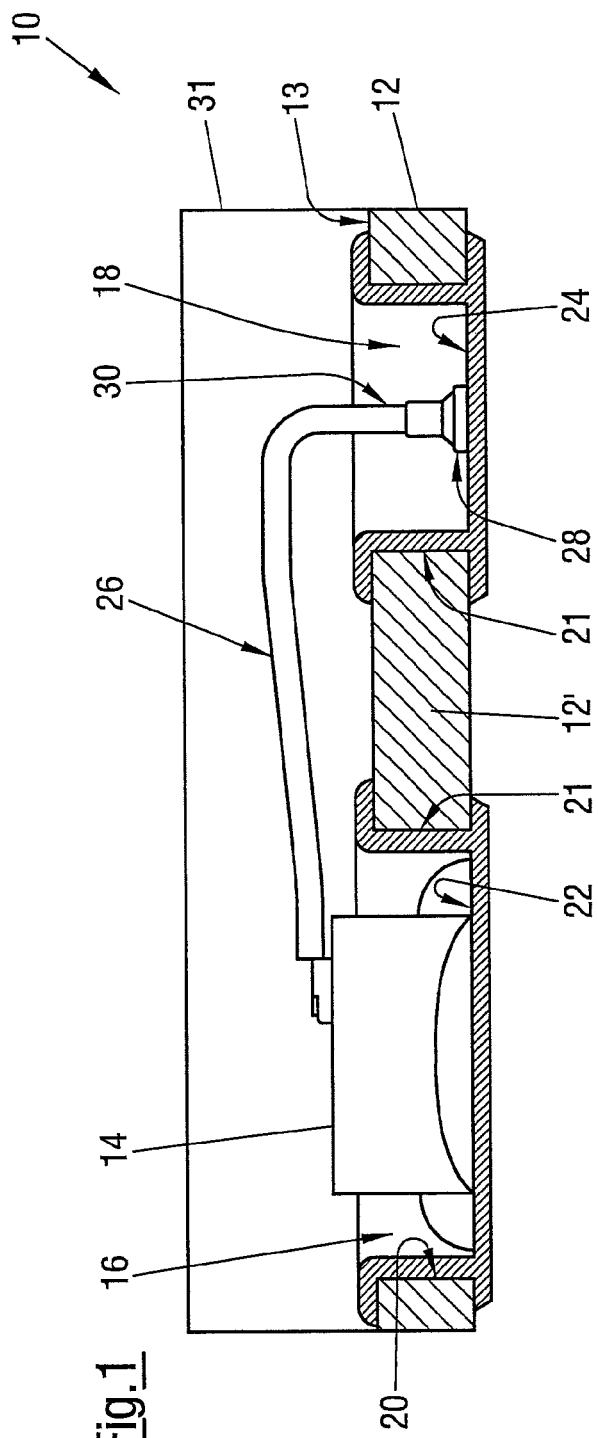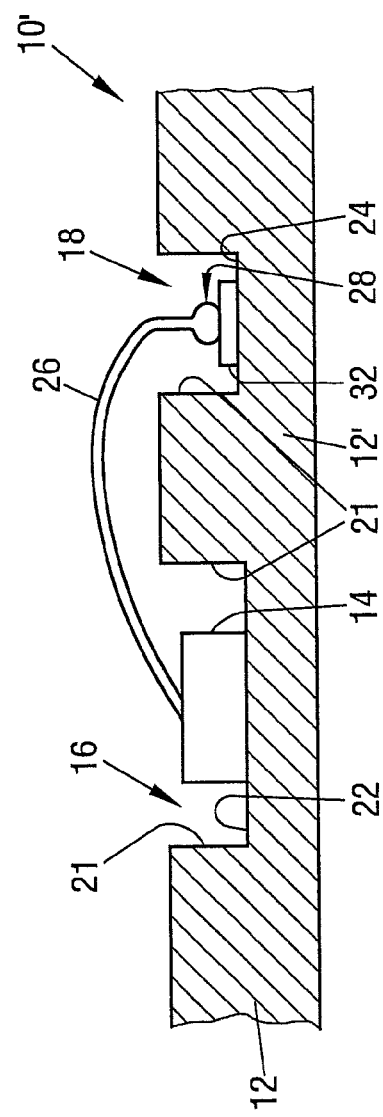

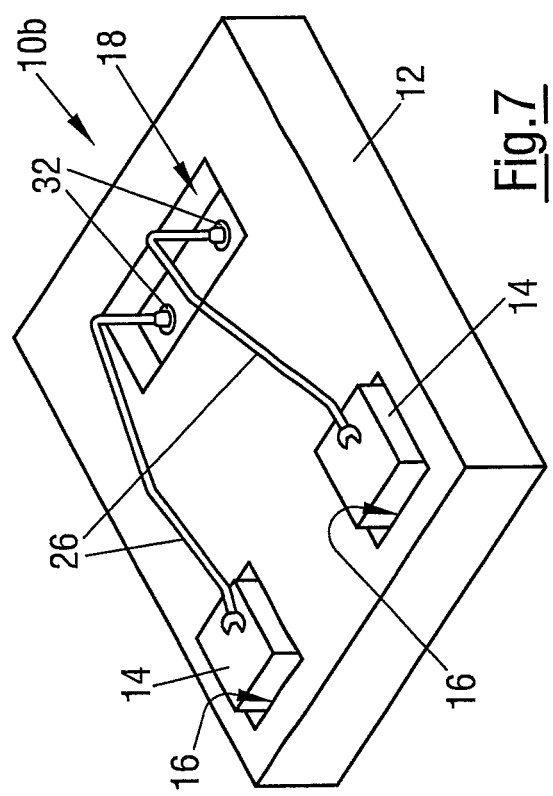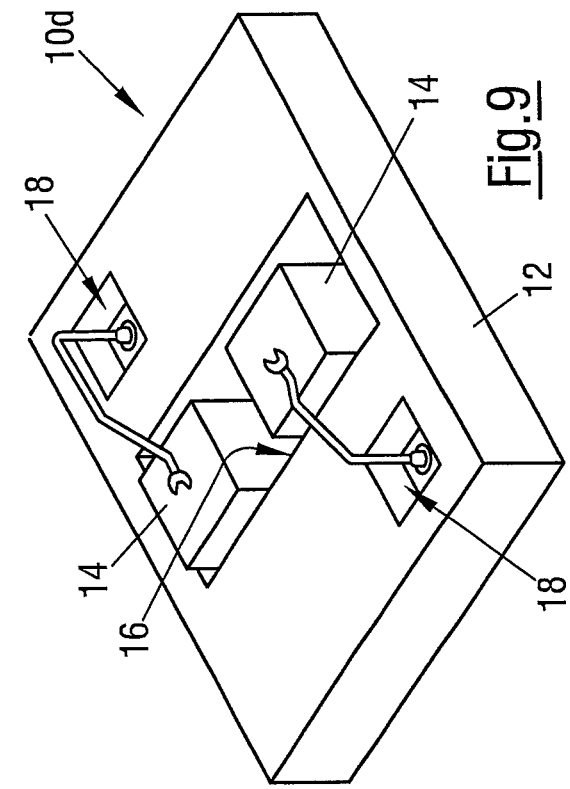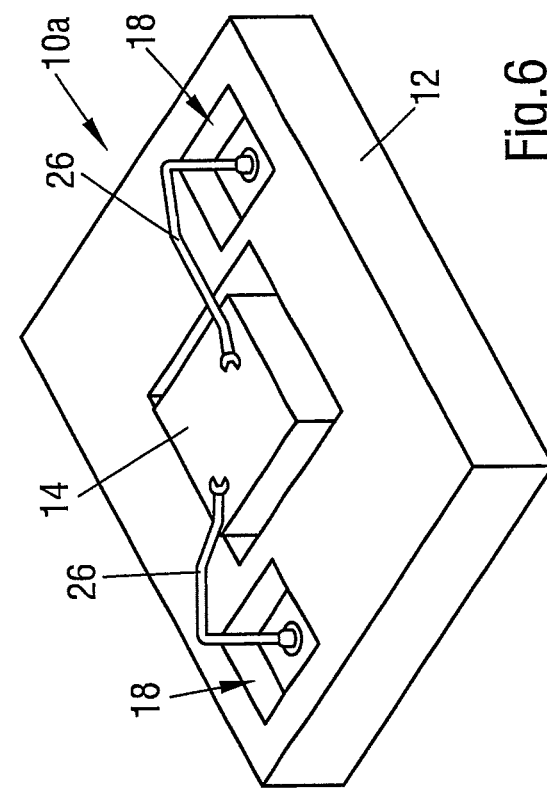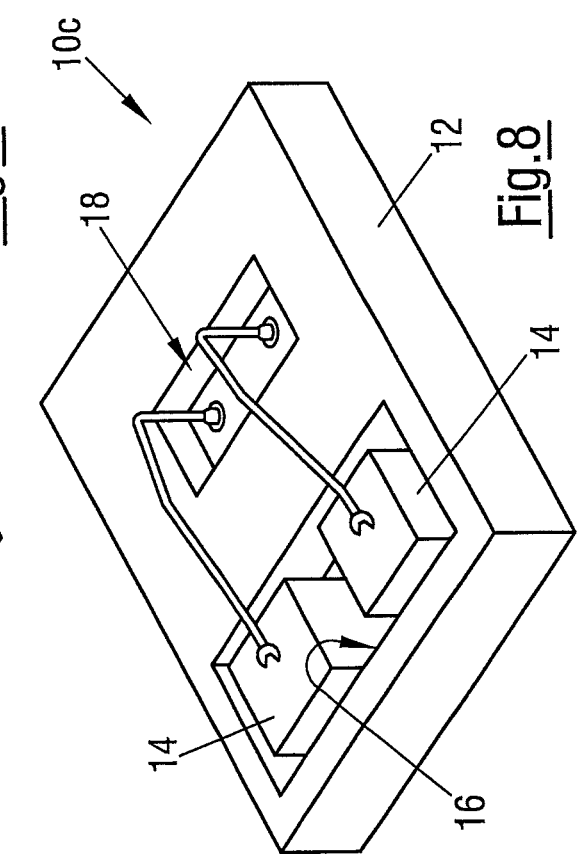

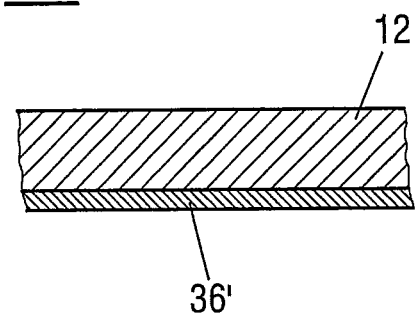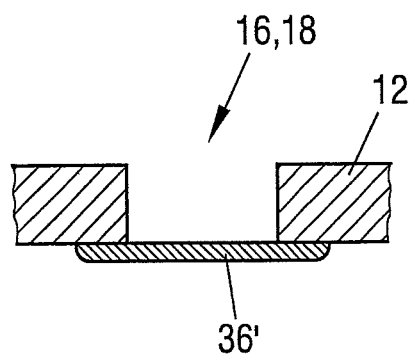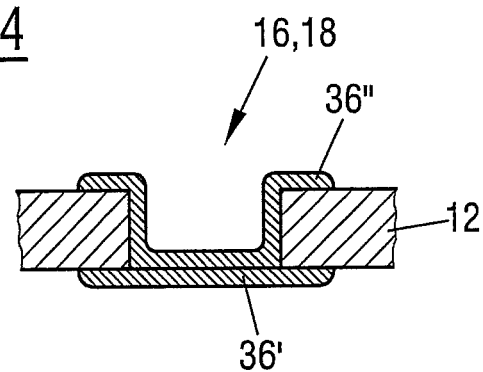

ELECTRONIC UNIT

CROSS REFERENCE TO RELATED APPLICATION(S)

This application is a § 371 application of International Application No. PCT/EP2017/056155, filed Mar. 15, 2017, which is incorporated by reference as if fully set forth.

FIELD OF INVENTION

The present invention relates to an electronic unit having at least one first electronic component and one second electronic component that are fastened to a substrate.

BACKGROUND

Problems can result on the positioning of electronic components on a substrate if at least one of these components emits electromagnetic radiation, in particular if the components are arranged in close spatial proximity to one another. This radiation may possibly impair the function of the other component. It is, however, unavoidable in some cases or is even wanted for specific reasons to position a component emitting electromagnetic radiation and a corresponding receiver component close next to one another. It must be reliably prevented in such cases that the emitted radiation directly acts on the receiver component. A shielding can be provided between the two components for this purpose. Such shieldings of a known design are, however, comparatively complex and therefore expensive in manufacture.

SUMMARY

It is therefore an object of the present invention to provide an electronic unit of the initially named kind that comprises a shielding that is arranged between the first and second electronic components and can be manufactured simply and inexpensively with a design that is as compact as possible.

This object is satisfied by an electronic unit having the features of claim 1.

In accordance with the invention, the shielding is an elevated portion that projects from a plane defined by the substrate or that extends from its surface, that acts as a shielding and that is formed in one piece with the substrate. I.e. the shielding is formed to a very large part by the material of the substrate and extends from the part of the substrate carrying the components. The elevated portion thus represents a shielding barrier for the radiation. The elevated portion is, for example, a kind of wall that extends between the two components and thus shields the radiation emitted by one of the two parts such that said radiation does not act directly on the second electronic component, for example a corresponding sensor component. A single-piece manner of construction lowers the manufacturing costs of the unit. A subsequent adhesion or molding on of the elevated portion is namely omitted.

The unit in accordance with the invention preferably forms a component, in particular an SMD component, that is in turn installed in a larger electronic unit, e.g. in a circuit.

Further embodiments of the invention are set forth in the description, in the dependent claims and in the enclosed drawings.

In accordance with an advantageous embodiment, the elevated portion is produced by a stripping production process from the substrate, in particular a circuit board. For example, material of the substrate is stripped from a blank around the elevated portion, e.g. by etching, milling and/or laser ablation.

It is, however, also possible to produce the substrate with the elevated portion by an injection molding engineering process. I.e. the substrate is a so-called molded interconnect device (MID). The elevated portion and—if required—further structures of the substrate are thus shaped during the injection molding of the substrate. This reduces the method steps required for manufacturing the spatial structure of the substrate.

The substrate can also be produced by 3D printing. It is also conceivable that the substrate is formed from laminated films, with more films being provided in the region of the elevated portion than in adjacent regions of the substrate.

Provision can be made that the first electronic component is arranged in a first recess of the substrate and/or the second electronic component is arranged in a second recess of the substrate. The shielding effect of the elevated portion is thereby improved—with the same height. In other words, the arrangement of one of the components or of both components in corresponding recesses, in particular separate recesses, results in an improved shielding and in a reduction of the construction height of the electronic unit.

The first electronic component and/or the second electronic component can be electrically conductively connected by an electrically conductive contact element, in particular a wire, to a contact point arranged at a base section of a third recess. This measure also reduces the construction height of the electronic unit since the connection point of the contact element to the contact point is "sunk". In this respect, any component can be connected to a contact point arranged in a separate third recess.

The electronic component can have a contact section that is connected to the contact element and that is arranged at a side of the electronic component remote from the base section of the first recess. The electronic components are in particular semiconductor components.

The elevated portion in particular projects further from the plane defined by the substrate than the contact element. An upper edge of the elevated portion defines the construction height of the unit, for example.

To improve the shielding effect, the elevated portion can be coated at least section-wise, in particular with a material shielding electromagnetic radiation. It can thereby be brought about that the elevated portion is substantially non-permeable for the radiation to be shielded. A shielding can, for example, be based on an effect of the coating material used that reflects and/or absorbs the radiation. Electrically conductive materials have such a shielding effect, but so do a number of non-metallic materials, e.g. reflective silicates or absorbing organic compounds.

The first recess, the second recess and/or, where present, the third recess(es) can—additionally or alternatively—be coated at least section-wise with an electrically conductive material. The coating of the named recesses can—if required—be in contact with a section of the coating of the elevated portion.

The invention further relates to a method of manufacturing an electronic unit that is in particular designed in accordance with one of the above embodiments. The method comprises the steps:

providing a substrate;

regionally stripping or removing a material of the substrate for producing an elevated portion that projects from a plane defined by the substrate or that extends from its surface and that acts as a shielding, in particular by milling, etching and/or laser ablation; and mounting a first electronic component and a second electronic component on the substrate such that the elevated portion is arranged between the two electronic components.

An alternative method of manufacturing an electronic unit that is in particular carried out in accordance with one of the above-described embodiments comprises the steps:

forming a plastic-based substrate by an injection molding process such that an elevated portion is produced that projects from a plane defined by the substrate or that extends from its surface and that acts as a shielding; and mounting a first electronic component and a second electronic component on the substrate such that the elevated portion is arranged between the two electronic components.

A further method of manufacturing an electronic unit that is in particular carried out in accordance with one of the above-described embodiments comprises the steps:

forming a plastic-based substrate by a 3D printing process such that an elevated portion is produced that projects from a plane defined by the substrate or that extends from its surface and that acts as a shielding; and mounting a first electronic component and a second electronic component on the substrate such that the elevated portion is arranged between the two electronic components.

The 3D printing is thus a "constructive" method of producing a single-piece substrate.

Yet a further "constructive" method of manufacturing an electronic unit that is in particular carried out in accordance with one of the above-described embodiments comprises the steps:

forming a plastic-based substrate by films or layers, in particular textile mats, connected to a binding agent, in particular resin, such that an elevated portion is produced that projects from a plane defined by the substrate or that extends from its surface and that acts as a shielding; and mounting a first electronic component and a second electronic component on the substrate such that the elevated portion is arranged between the two electronic components.

The films can be cut to size prior to their connection such that they produce the desired three-dimensional structure of the substrate in a state placed over one another. The substrate in particular has a larger number of films or layers in the region of the elevated portion than in adjacent regions.

The above-described method, for example, comprises the laminating of a plurality of films or layers such as is known from the manufacture of conventional circuit boards.

Mixed forms of the above-described methods are likewise conceivable to obtain a substrate optimized for the respective application or to lower its manufacturing costs.

However, it is common to all the methods that a unit is obtained in which the elevated portion is an integral component of the substrate. The elevated portion is in particular composed of the same material as the rest of the substrate. The elevated portion is therefore not subsequently fastened to the substrate that is complete per se.

The elevated portion can be at least partly coated, in particular with a material shielding electromagnetic radiation.

BRIEF DESCRIPTION OF THE DRAWING(S)

The present invention will be explained in the following with reference to advantageous embodiments purely by way of example and with reference to the enclosed drawings. There are shown:

FIG. 1a shows a cross-section through a first embodiment of an electronic unit;

FIG. 2a shows a cross-section through a second embodiment of an electronic unit;

FIGS. 6 to 10 shows further embodiments of an electronic unit;

FIGS. 12 to 14 show an embodiment of a manufacturing method for producing the first or second recesses.

DETAILED DESCRIPTION OF THE PREFERRED EMBODIMENT(S)

Figure 3:
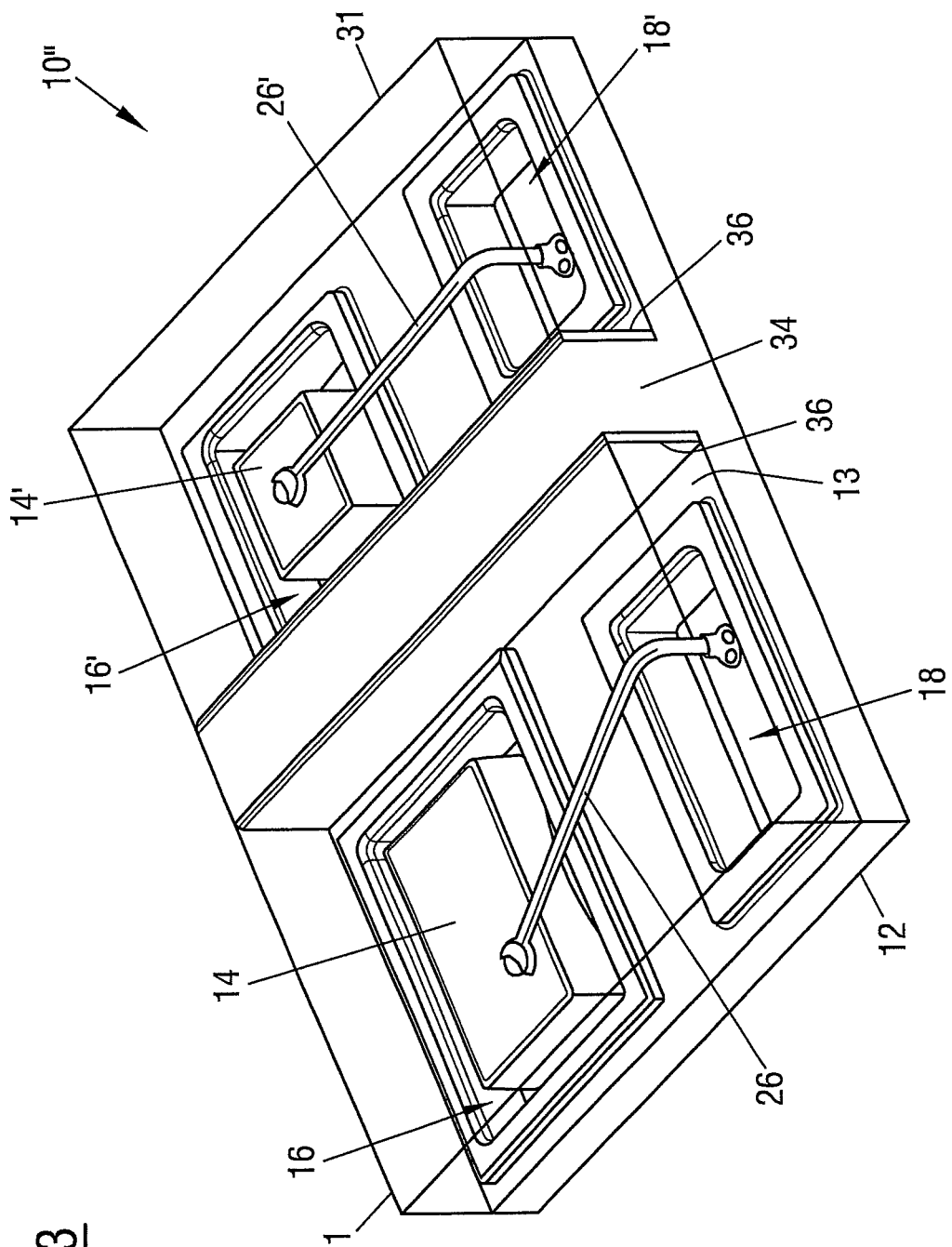
FIG. 3a shows a perspective view of an embodiment of the unit in accordance with the invention.

FIG. 1 shows an electronic unit 10 that comprises a substrate 12—specifically a circuit board—and an electronic component 14. The electronic component 14 is, however, not arranged on a surface 13 of the substrate 12, but rather in a recess 16 such that an upper edge of the component 14 only slightly projects beyond the side at the top in FIG. 1 or beyond the surface 13 of the surface 12. The recess 16 can also be at least so deep that it completely accommodates the component 14.

The recess 16 comprises a passage opening 20 that penetrates through the substrate 12 and that is closed again at one side in the course of a coating process. I.e. a base section 22 formed by the coating material is formed in a manner known per se by a coating process. The side walls of the recess 16 and adjacent regions of the surface 13 are also coated in this process—or in a separate step. The coating material, the coating thickness and/or the selection of the coated sections can be adapted to the respective demands made.

The component 14 can be fixed to the base section 22 in a conventional manner. A contacting of the component 14 can be provided in this respect. It is, however, also conceivable that the component 14 is fixed to the base section 22, in particular adhesively bonded, without establishing an electric contact.

The component 14 is preferably a semiconductor component. To be able to connect the component 14 to an electrical terminal, a wire 26 is provided that is electrically conductively fastened to a contact surface provided at the upper side of the component 14. The establishing of the connection between the wire 26 and the contact point can take place by wedge bonding, for example.

The wire 26 establishes an electrically conductive connection 28 to a base section 24 of a second recess 18. The base section 24 is electrically conductive and was produced in a similar/the same manner as the base section 22 of the recess 16. The connection 28 between the wire 26 and the base section 22 takes place by "ball bonding". The base section 24 is thus a contact point for the wire 26. The contact point can in turn be connected to further terminals via conductor tracks or other measures to integrate the unit 10 e.g. into a circuit.

The establishing of the connection between the component 14 and the base section 24 expediently takes place in the following manner:

An end of the wire 26 is first melted such that a molten ball is formed that is pressed onto the corresponding contact surface/contact point (here the base section 24). The wire 26 is subsequently led to the second contact point (here a contact surface at the upper side of the component 14) and is there contacted by means of ultrasound, heat and/or pressure. The method described by way of example is thus a "reverse ball/wedge bonding process". Other contacting methods can likewise be used. A "ball" can, for example, be formed on the contact point at the upper side of the component 14 before the above-described procedure. The wire 26 is then cut and the "reverse ball/wedge bonding process" is subsequently carried out, with the wire 26 then not being directly fixed to the contact point of the component 14, but rather at the ball located there (reverse "ball stitch on ball"—reverse BSOB).

Since a substantial amount of heat has to be introduced into the wire 26 to form the molten ball, a section 30 of the wire 26 adjoining the connection 28 is briefly subjected to a high thermal load. The section 30 is therefore subsequently mechanically much more sensitive than regions of the wire 26 subjected to a lower thermal load. The "sinking" of the connection 28 in the recess 18 makes it possible not to have to mechanically deform the thermally loaded region 30 during the bonding process. I.e. it can just be "pulled" upwardly without this having a negative effect on the construction height of the total arrangement.

To fix the arrangement and to protect its components, it is cast with a suitable material (casting compound 31).

Figure 11:
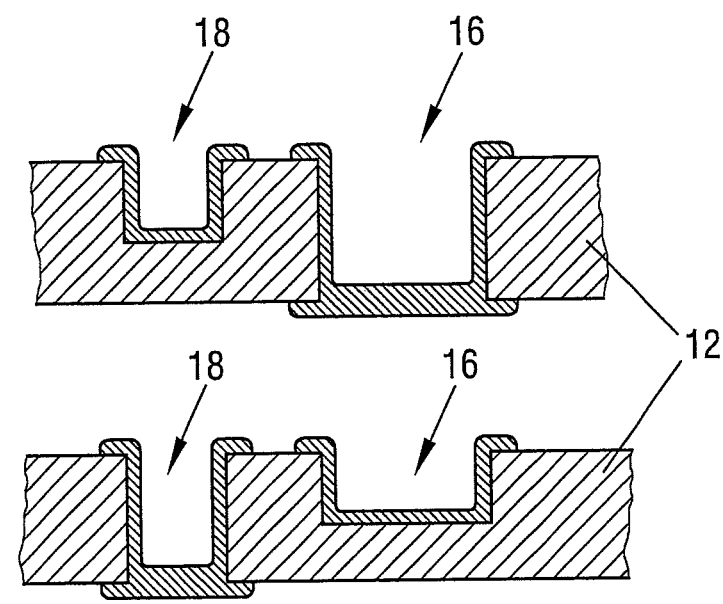
FIG. 11 shows different embodiments of the first or second recesses in two cross-sections.

FIG. 2 shows an alternative embodiment 10' of the electrical unit. No passage openings are present here, but the base sections 22, 24 of the recesses 16, 18 are rather formed by the substrate 12 itself—here a circuit board, for example. The recesses 16, 18 are thus depressions in the material of the substrate 12. They do not penetrate the substrate 12. Combining recesses produced from passage openings and recesses formed as depressions in an electronic unit is likewise possible (see e.g. FIG. 11). It is understood that the recesses 16, 18 can be completely or partly coated. It is shown by way of example that the recess 18 has a partly coated section (contact point 32) that is connected to the wire 26 in an analog configuration to the embodiment 10 shown in FIG. 1.

To protect the electronic unit 10' and its components, it is also cast using a casting compound (not shown).

The term "substrate" is to be interpreted widely within the framework of the present disclosure. It is generally possible to configure a lead frame correspondingly. A lead frame can also have a plurality of separate carrier sections that are connected to one another by a plastic. The substrate 12 is, however, preferably a circuit board.

The recesses 16, 18 of the units 10, 10' comprise side walls 21 that adjoin the respective base section 22, 24 at all sides and thus surround it at all sides. It is generally also conceivable to leave one or more sides of the recesses 16, 18 (partly) open. It is, however, preferred to provide a substrate section 12' between the connection 28 or the contact point 32 and the component 14. I.e. the corresponding recess 16, 18 preferably has at least one side wall 21 or side wall section that face the other recess 18 or 16. The substrate section 12' can have substantially the same thickness as other regions of the substrate 12 adjacent to the recesses 16, 18.

FIG. 3 shows a perspective view of an electronic unit 10''. The electronic unit 10'' comprises two electronic components 14, 14' that are arranged in recesses 16 or 16' respectively. They are each connected to a contact point in a recess 18 or 18' or to the respective base section via wires 26, 26'. The recesses 16, 16', 18, 18' are designed, for example, such as those in FIG. 1.

In particular when the components 14, 14' are a transmitter component emitting electromagnetic radiation and a corresponding receiver component, it is sensible to provide a reliable shielding acting between the components 14, 14' on an adjacent arrangement of the components 14, 14'. This shielding is provided in the present case by a wall 34 that extends between the components 14, 14'. It is an elevated portion that rises from the plane that is defined by the substrate 12. Or in other words: The wall 32 extends from the surface 13 of the substrate 12.

The wall 34 is connected in one piece to the substrate 12 or it is a part of the substrate 12. This has the advantage that it can be produced in a simple manner. It is, for example, shaped from a substrate blank by a production method stripping material. I.e. the regions around the wall 34 are removed by one or more suitable processes such as etching, milling and/or laser ablation. In this respect, the recesses 16, 18, 16', 18' or corresponding passage openings 20 or the substrate can also be formed by non-penetrating depressions (see e.g. FIGS. 2 and 11).

It is, however, also conceivable to form the substrate 12 with the help of MID technology. In this respect, it is a process by which molded interconnect devices are produced. These interconnect devices are thus injection molded plastic parts having suitably applied metallic conductor tracks and/or coating sections.

A further manufacturing process is so-called 3D printing. I.e. the substrate 12 is built up layerwise in the desired geometry by means of suitable materials such that the recesses 16, 18, 16', 18' and/or the wall 34 are produced "constructively" as required. A stripping workstep is then no longer required in the ideal case.

A likewise "constructive" manufacturing variant of the substrate 12 provides for a lamination of layers having different geometries. For example, fabric mats of suitable shape—e.g. with openings where the recesses 16, 18, 16', 18' are to be provided—are laid over one another and are connected by resin. It is also possible to configure the substrate 12 as thicker in specific regions—e.g. in that a larger number of mat layers are provided there—for example, to form the wall 34.

Mixed forms of the described processes are also possible. E.g. a part substrate can be produced by stripping method steps that is then laminated onto another part substrate (base, as a rule itself a laminated component).

It is common to all the manufacturing variants that a single-piece substrate 12 is obtained.

It can be recognized in the present example that the wall 34 is provided with a coating 36 at both sides—a single-sided coating can also be sufficient in specific applications—that can be connected to other coating sections as required. In the present embodiment, the coating 36 of the left side of the wall 34 is in contact with the coating of the recess 16. The material of the coating 36 is preferably selected such that the wall 34 is non-penetrable for the radiation emitted by the component 14 and/or 14' or at least attenuates it.

The wall 34 preferably also defines the upper edge of the casting compound 31 to form a compact construction unit without projecting edges.

Figure 4:
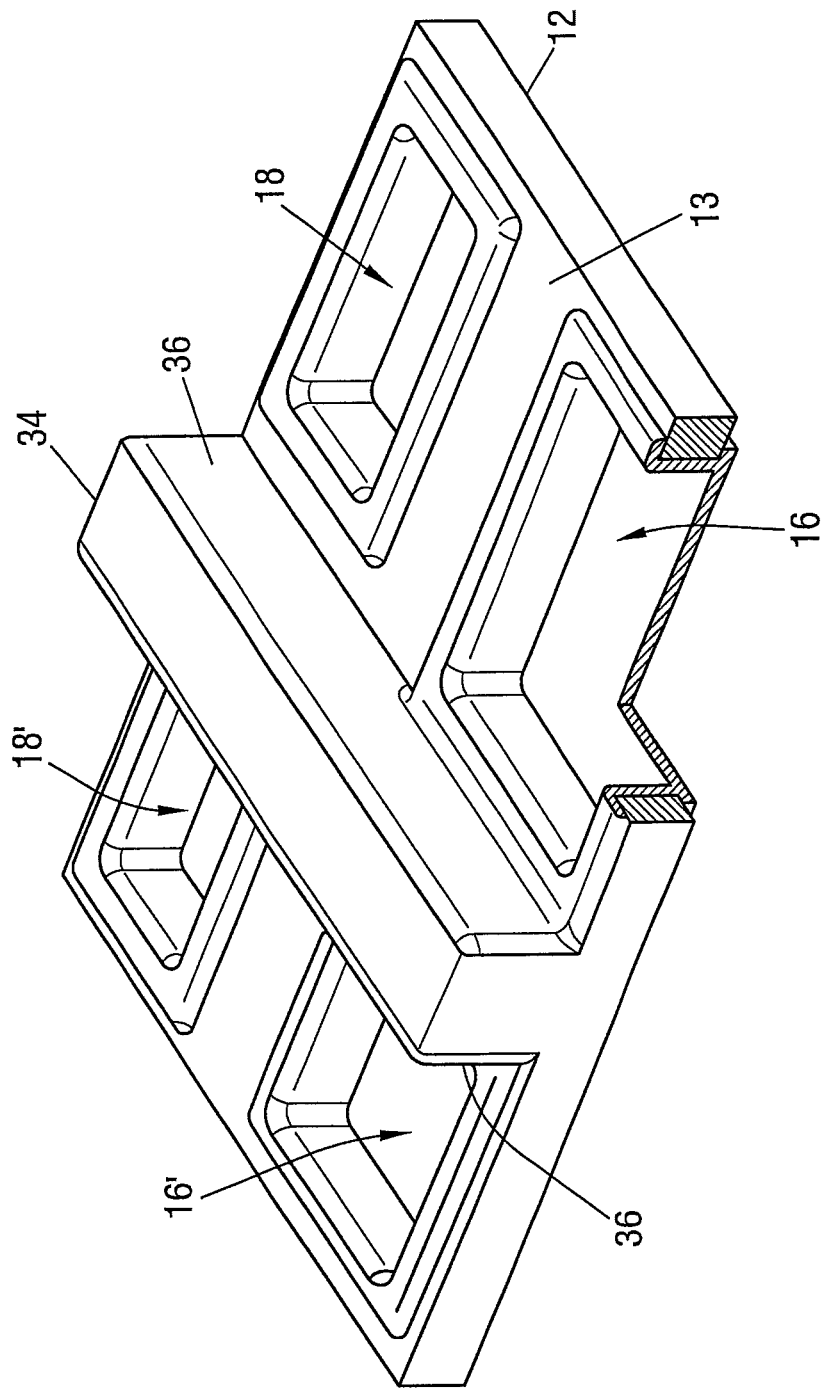
FIGS. 4 and 5 shows different sections through a substrate with recesses.

FIG. 4 shows the substrate 12 provided with the wall 34 in a perspective view without the components 14, 14' or wires 26, 26'. The recess 16 is shown partly open to show that it is substantially configured as was explained with respect to FIG. 1.

Figure 5:
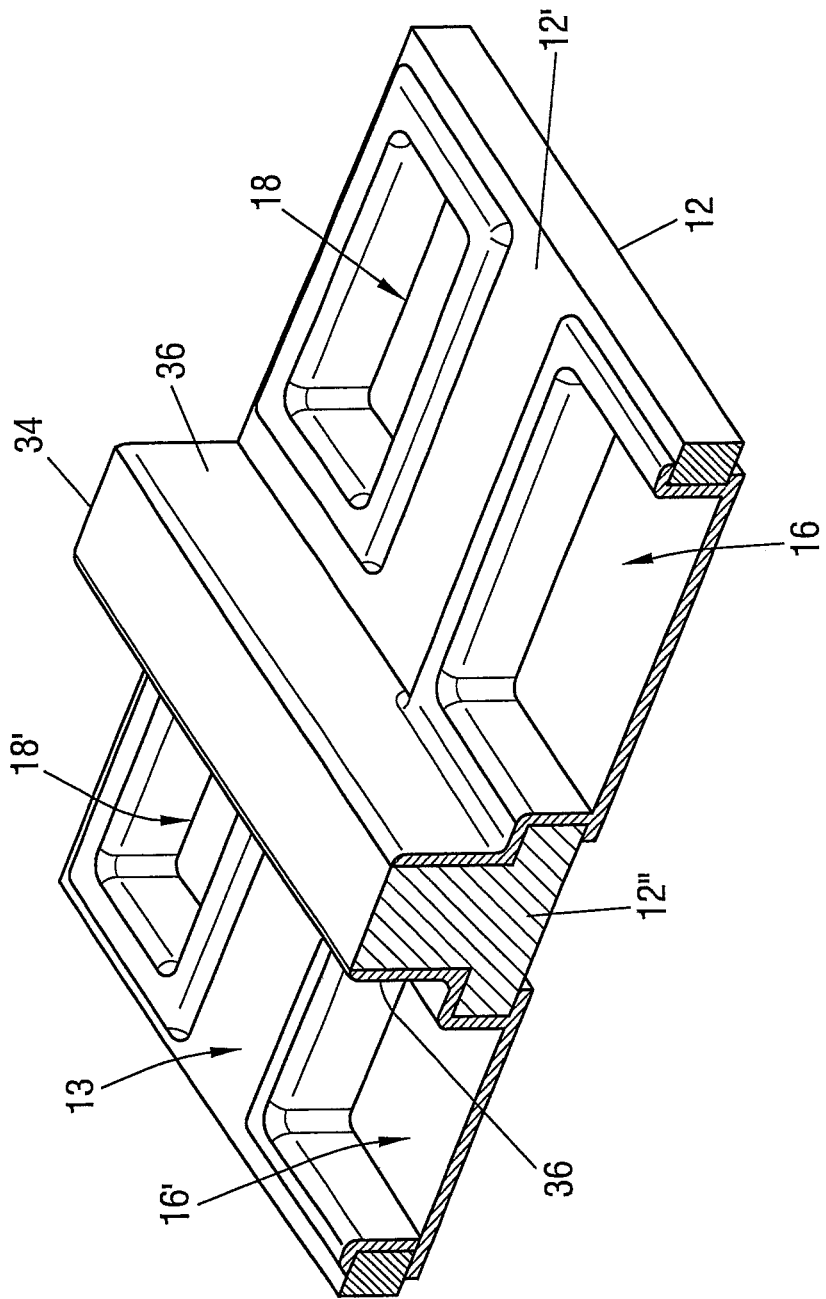
Figure 10:
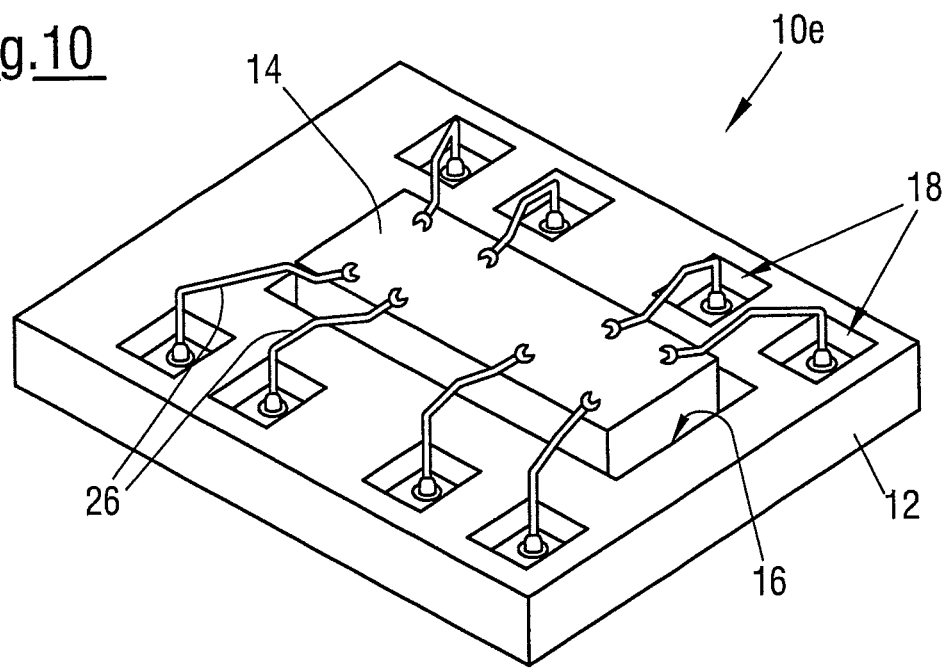

FIG. 5 shows the substrate 12 of FIG. 4 in a complete section such that the design of the wall 34 can also be recognized that extends from a substrate section 12" arranged between the recesses 16, 16'. The substrate 12 and the wall 34 are formed in one piece. The wall 34 has a coating 36 at two sides that are connected to the respective coatings of the recesses 16' (left) or 16 (right).

The idea of a wall shielding radiation can be implemented independently of the idea of positioning the electronic component and the contact point in separate recesses.

FIGS. 6 to 10 show by way of example the variety with which possible embodiments of the electronic unit in accordance with the invention can be configured.

A unit 10a e.g. comprises two recesses 18 that each serve for the contacting of one of the two wires 26 that are both connected to the component 14 (cf. FIG. 6).

In contrast to this, a unit 10b has two components 14 what are each arranged in a separate recess 16 and that are each connected to a wire 26. The wires 26 are in turn connected to separate contact points 32 that are arranged in a common recess 18 (cf. FIG. 7).

A unit 10c differs from the unit 10b in that the components 14 are arranged in a common recess 16 (cf. FIG. 8).

In a unit 10d, the components 14 are admittedly arranged—as with the unit 10c—in a common recess 16. However—as with the unit 10a—two separate recesses 18 are provided (cf. FIG. 9).

A unit 10e has a component 14 that is arranged in a separate recess 16 (cf. FIG. 10). 8 wires 26 are fastened thereto that are in turn connected to separate contact points 32 that are arranged in 8 separate recesses 18.

Mixed forms of the above-described embodiments are easily possible. The number and the configuration (e.g. geometry, coating, . . . ) of the recesses 16, 18 can be adapted to the respective demands made, as can be seen, for example, from FIG. 11. The recesses 16, 18 have different depths here.

A variant for manufacturing an embodiment of the recess 16, 18 will be described in the following with reference to FIGS. 12 to 14.

FIG. 12 shows a substrate 12 coated at one side. The coating 36' is, for example, a metal film. The recess 16, 18 is introduced into the substrate 12 by a material-stripping process. The method is preferably a laser ablation process. If the coating 36' is metallic (e.g. Cu), the stripping ends automatically when the substrate 12 has been completely penetrated (see state in FIG. 13). If the laser used is too powerful, the incident laser beam is namely reflected as soon as it is incident onto the surface of the coating 36' facing the substrate. The coating 36' can be removed regionally as required (see FIG. 13).

A coating 36" is optionally subsequently applied that partly or completely lines the recess 16, 18 (see FIG. 14). Where required—simultaneously with the application of the coating 36" or in a separate step—the coating 36' can also be—partly or completely—coated or covered. The material of the coatings 36', 36" can be the same or different.

Figure 15:
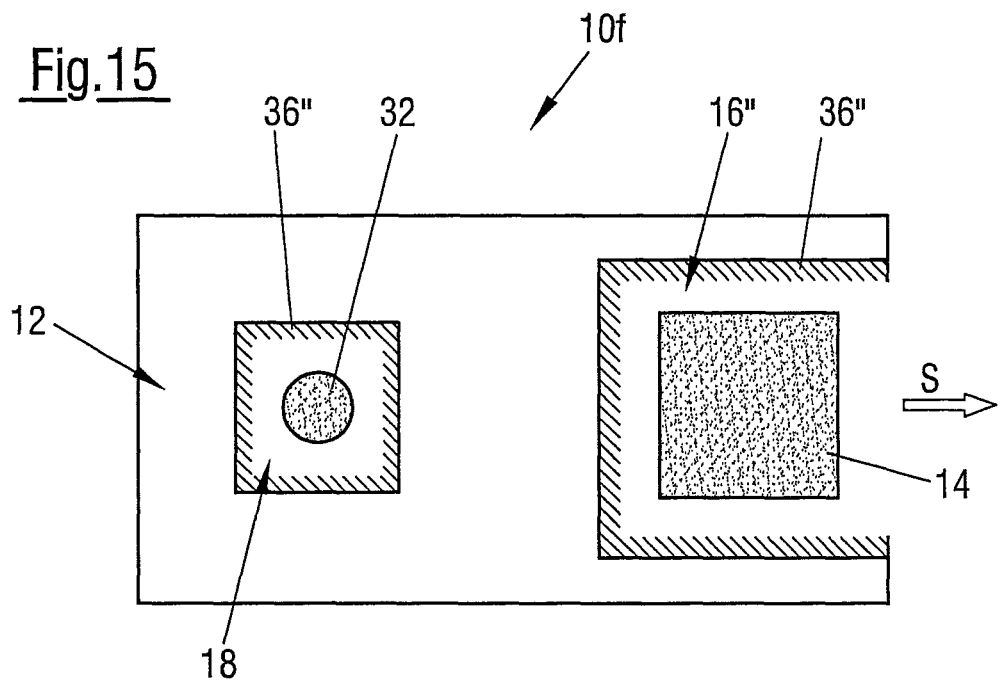
FIGS. 15 and 16 show yet a further embodiment of an electronic unit in a plan view or in a cross-section.
Figure 16:
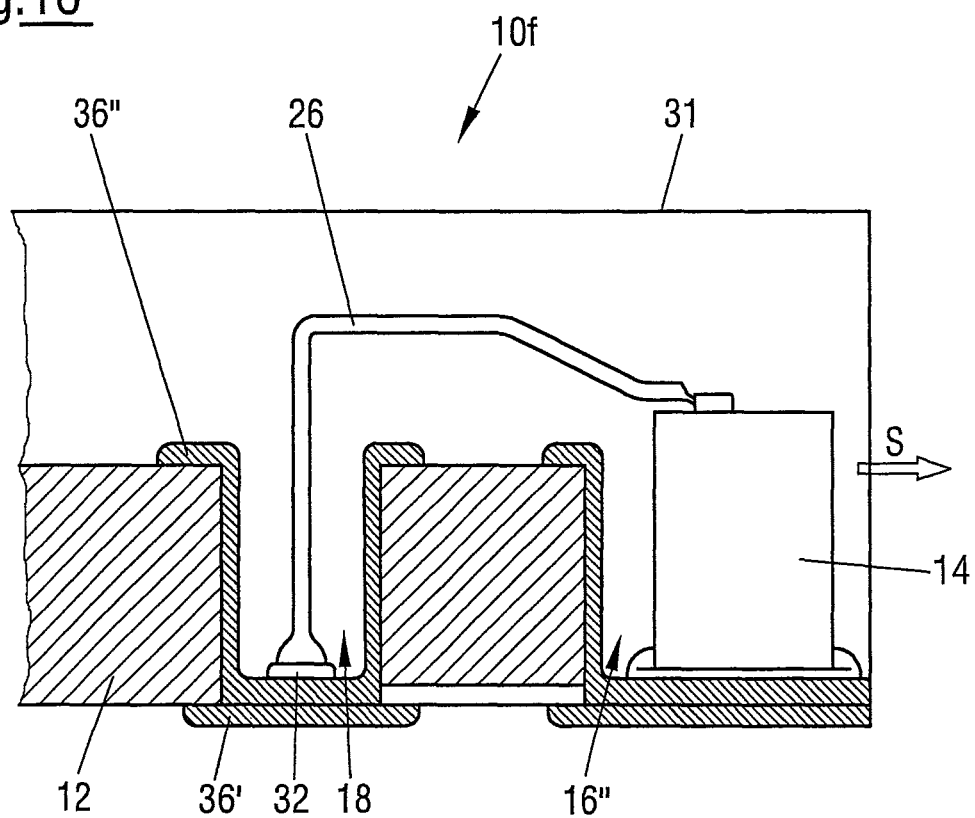

FIG. 15 shows a unit 10f with a component 14 (e.g. an LED) that is arranged in a coated (coating 36") recess 16" open at one side. The component 14 can thereby emit electromagnetic radiation S to the right in an unimpeded manner. A bond wire 26 connected to the component 14 is connected to a contact point 32 arranged in a recess 18 closed in the peripheral direction (see also FIG. 16). The components of the unit 10f and in particular their electrical contacting are protected by a casting compound 31.

REFERENCE NUMERAL LIST 10, 10', 10", 10a-10f electronic unit
12 substrate
12', 12" substrate section
13 surface
14, 14' electronic component
16, 16', 16" recess
18, 18', recess
20 passage opening
21 side wall
22, 24 base section
26, 26' wire
28 connection
30 wire section
31 casting compound
32 contact point
34 wall
36, 36', 36" coating
S radiation

The invention claimed is:

1. An electronic unit comprising:
at least one first electronic component and one second electronic component that are fastened to a substrate; and
a shielding arranged between the first and second electronic components, wherein the shielding comprises an elevated portion that projects from a plane defined by the substrate or extends from a surface of the substrate, and wherein the shielding acts as a shielding and is formed in one piece with the substrate, and wherein at least one of the first electronic component and the second electronic component is electrically conductively connected, by a wire, to a contact point arranged at a base section of a third recess.

2. The electronic unit in accordance with claim 1, wherein the elevated portion is formed from the substrate by a stripping production method, wherein the stripping production method includes at least one of etching, milling and laser ablation.

3. The electronic unit in accordance with claim 1, wherein the substrate is produced by a molded interconnect device (MID) process.

4. The electronic unit in accordance with claim 1, wherein the substrate is produced by 3D printing.

5. The electronic unit in accordance with claim 1, wherein the substrate is formed from laminated films, with more films being provided in a region of the elevated portion than in adjacent regions of the substrate.

6. The electronic unit in accordance with claim 1, wherein at least one of: the first electronic component is arranged in a first recess of the substrate and the second electronic component is arranged in a second recess of the substrate.

7. The electronic unit in accordance with claim 1, wherein the elevated portion projects further from the plane defined by the substrate, or extends further from the surface of the substrate, than a contact element.

8. The electronic unit in accordance claim 1, wherein the elevated portion is at least partly coated with a material shielding electromagnetic radiation.

9. The electronic unit in accordance with claim 8, wherein a coating of at least one of the first recess and the second recess is in contact with a section of a coating of the elevated portion.

10. The electronic unit in accordance with claim 1, wherein at least one of the first recess and the second recess are coated at least sectionally with electrically conductive material.

11. The electronic unit in accordance with claim 1, wherein at least one of the first electronic component and the second electronic component is a semiconductor component.

12. The electronic unit in accordance with claim 1, wherein the first electronic component is a component emitting electromagnetic radiation and the second electronic component is a component detecting electromagnetic radiation.

13. A method of manufacturing an electronic unit, comprising:
providing a substrate;
regionally stripping or removing a material of the substrate to produce an elevated portion that projects from a plane defined by the substrate or extends from a surface of the substrate and acts as a shielding, wherein the regionally stripping or removing includes at least one of milling, etching and laser ablation;
mounting a first electronic component and a second electronic component on the substrate such that the elevated portion is arranged between the two electronic components, and
electrically conductively connecting at least one of the first electronic component and the second electronic component, by a wire, to a contact point arranged at a base section of a recess located at a position other than where the first electronic component or the second electronic component are mounted.

14. A method of manufacturing an electronic unit comprising:
forming a plastic-based substrate such that an elevated portion is produced that projects from a plane defined by the substrate or extends from a surface of the substrate and acts as a shielding;
mounting a first electronic component and a second electronic component on the substrate such that the elevated portion is arranged between the two electronic components; and
electrically conductively connecting at least one of the first electronic component and the second electronic component, by a wire, to a contact point arranged at a base section of a recess located at a position other than where the first electronic component or the second electronic component are mounted.

15. The method of claim 14, wherein the plastic-based substrate is formed by one of an injection molding process, a 3D printing process, and by films connected to a binding agent.

16. The method in accordance with claim 15, wherein the films are cut to size prior to their connection such that they produce a three-dimensional structure of the substrate in a state laid over one another.

17. The method in accordance with claim 15, wherein the substrate has a larger number of films in a region of the elevated portion than in adjacent regions.

18. The method in accordance with claim 17, wherein the elevated portion is at least partly coated with a material shielding electromagnetic radiation.

19. The method in accordance with claim 15, wherein the films are textile mats and the binding agent is resin.

* * * * *